US010622717B2

(12) United States Patent
Yen et al.

(10) Patent No.: US 10,622,717 B2
(45) Date of Patent: Apr. 14, 2020

(54) MOBILE DEVICE

(71) Applicant: Acer Incorporated, New Taipei (TW)

(72) Inventors: Ming-Ching Yen, New Taipei (TW); Shih-Ting Huang, New Taipei (TW); Kun-Sheng Chang, New Taipei (TW); Ching-Chi Lin, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 31 days.

(21) Appl. No.: 16/000,971

(22) Filed: Jun. 6, 2018

(65) Prior Publication Data

US 2019/0296438 A1 Sep. 26, 2019

(30) Foreign Application Priority Data

Mar. 26, 2018 (TW) ............................. 107110286 A

(51) Int. Cl.
*H05K 7/00* (2006.01)
*H01Q 5/50* (2015.01)
(Continued)

(52) U.S. Cl.
CPC ............. *H01Q 5/50* (2015.01); *H01Q 1/2266* (2013.01); *H01Q 1/38* (2013.01); *H01Q 3/443* (2013.01);
(Continued)

(58) Field of Classification Search
CPC ........ H01Q 13/16; H01Q 13/10; H01Q 3/443; H01Q 7/00; H01Q 13/18; H01Q 21/064;
(Continued)

(56) References Cited

U.S. PATENT DOCUMENTS 4,625,212 A * 11/1986 Oda ........................ H01Q 1/243
343/702
5,936,583 A * 8/1999 Sekine ................... H01Q 1/245
343/702
(Continued)

FOREIGN PATENT DOCUMENTS

TW 201703350 A 1/2017

OTHER PUBLICATIONS

TW Office Action, dated Mar. 8, 2019, 6 pages.
TW Search Report, dated Mar. 6, 2019, 1 page.

*Primary Examiner* — Binh B Tran
(74) *Attorney, Agent, or Firm* — Edell, Shapiro & Finnan, LLC

(57) ABSTRACT

A mobile device includes a first nonconductive support member, a second nonconductive support member adjacent to, and lower than, the first nonconductive supporting member, and an antenna structure that includes a first radiating portion disposed on the first nonconductive support member, a second radiating portion disposed on the first nonconductive support member and extending in a direction opposite to the first radiating portion, a feeding element, and a connecting portion disposed on the first nonconductive support member and the second nonconductive support member that couples the first radiating portion and the second radiating portion to each other and to the feeding element, wherein the first nonconductive support member is part of a visible outside edge portion of the mobile device.

19 Claims, 7 Drawing Sheets

(51) Int. Cl.

| | |
|---|---|
| ***H01Q 1/22*** | (2006.01) |
| ***H01Q 1/38*** | (2006.01) |
| *H05K 5/00* | (2006.01) |
| *H05K 7/10* | (2006.01) |
| *H01Q 13/16* | (2006.01) |
| *H01Q 13/10* | (2006.01) |
| *H01Q 3/44* | (2006.01) |
| *H01Q 7/00* | (2006.01) |
| *H01Q 13/18* | (2006.01) |
| *H01Q 21/06* | (2006.01) |
| *H01Q 21/00* | (2006.01) |

(52) U.S. Cl.
CPC ............... *H01Q 7/00* (2013.01); *H01Q 13/10* (2013.01); *H01Q 13/16* (2013.01); *H01Q 13/18* (2013.01); *H01Q 21/005* (2013.01); *H01Q 21/0043* (2013.01); *H01Q 21/0062* (2013.01); *H01Q 21/064* (2013.01)

(58) Field of Classification Search
CPC ............. H01Q 21/0043; H01Q 21/005; H01Q 21/0056; H01Q 21/0062
USPC .......................................... 361/746, 767–771
See application file for complete search history.

(56) References Cited

U.S. PATENT DOCUMENTS

2010/0177012 A1* 7/2010 Morrow ............. H01Q 21/0025 343/893
2015/0255853 A1 9/2015 Kwong et al.

* cited by examiner

MOBILE DEVICE

This application claims the benefit of Taiwan Application Serial No. 107110286, filed Mar. 26, 2018, the subject matter of which is incorporated herein by reference.

TECHNICAL FIELD

Embodiments of the present invention are directed to an antenna for a mobile device.

BACKGROUND

As mobile communication technology has continued to develop, mobile devices have become increasingly popular. Such devices include, for example, portable computers, mobile phones, multimedia players, and other hybrid portable electronic devices. In order to meet popular demand, mobile devices are configured for wireless communication. Some wireless communication configurations provide long-range coverage, while other wireless communication configurations provide short-range coverage. Example long-range communication coverage configurations include mobile phones that use 2G, 3G, and Long Term Evolution (LTE) systems in the 700 MHz, 850 MHz, 900 MHz, 1800 MHz, 1900 MHz, 2100 MHz, 2300 MHz, and 2500 MHz bands. Example short-range communication coverage configurations include Wi-Fi and Bluetooth systems that use the 2.4 GHz, 5.2 GHz, and 5.8 GHz frequency bands.

To achieve aesthetically pleasing mobile devices, designers often incorporate metal components including, e.g., metal case components. However, such metal components can detrimentally impact an antenna supporting wireless communication in the aforesaid bands, thereby reducing the overall communication performance of the mobile device. It is therefore desirable to provide a mobile device and associated antenna structure that addresses problems related to metal components incorporated in mobile device designs.

SUMMARY

In one embodiment there is provided a mobile device including a first nonconductive support member, a second nonconductive support member adjacent to, and lower than, the first nonconductive supporting member, and an antenna structure that includes a first radiating portion disposed on the first nonconductive support member, a second radiating portion disposed on the first nonconductive support member and extending in a direction opposite to the first radiating portion, a feeding element, and a connecting portion disposed on the first nonconductive support member and the second nonconductive support member that couples the first radiating portion and the second radiating portion to each other and to the feeding element, wherein the first nonconductive support member is part of a visible outside edge portion of the mobile device.

In an embodiment, the connecting portion comprises a first connecting portion and a second connecting portion, the second connecting portion coupling the first radiating portion and the second radiating portion to each other, and the first connecting portion coupling the feeding element to the second connecting portion. The first connecting portion may be disposed on the first nonconductive support member and the second nonconductive support member, and the second connecting portion is disposed on the first nonconductive support member The feeding element may be disposed on the second nonconductive support member.

The mobile device may further include a display having a display frame surrounding the display, wherein the display frame is disposed in a notch created by a difference in height between the first nonconductive support member and the second nonconductive support member.

The antenna structure may be configured to resonate at a low frequency band, a first high frequency band and a second high frequency band. The low frequency band may be between 2400 MHz and 2500 MHz, the first high frequency band may be between 5000 MHz and 5300 MHZ, and the second high frequency band may be between 5300 MHz and 5700 MHz.

In an embodiment, the mobile device is a laptop computer.

A stripe-like gap may be created between the first radiating portion and at least a portion of the feeding element.

The mobile device may further include a coaxial cable having an inner conductor and an outer conductor, the inner conductor couple to a feed point of the feeding element, and the outer conductor couple to a ground plane of the mobile device.

BRIEF DESCRIPTION OF THE DRAWINGS

Embodiments are described herein in conjunction with the accompanying drawings, in which.

DESCRIPTION OF EXAMPLE EMBODIMENTS

Figure 1A:
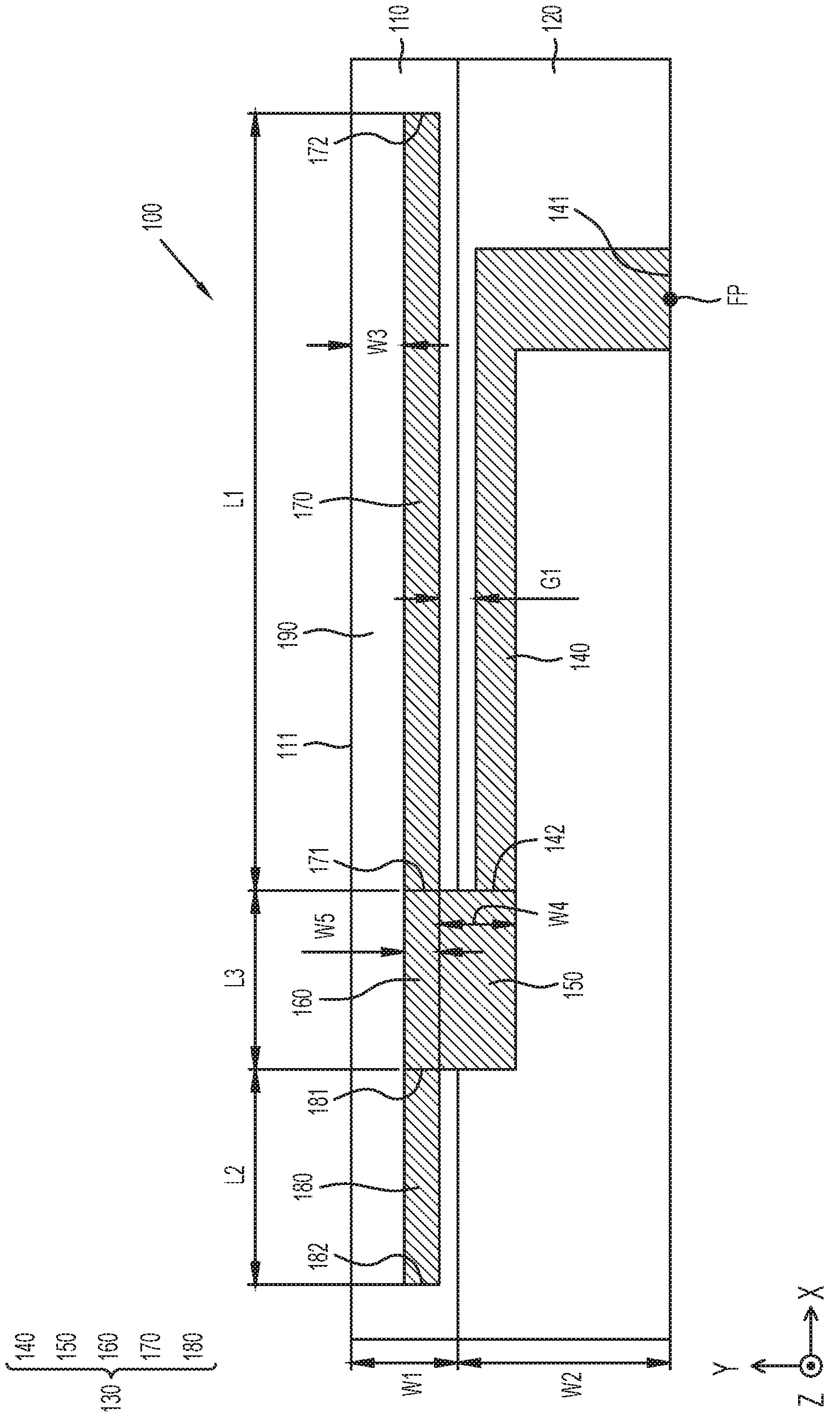
FIG. 1A is a plan view of a portion of a mobile device according to an embodiment of the present invention.
Figure 1B:
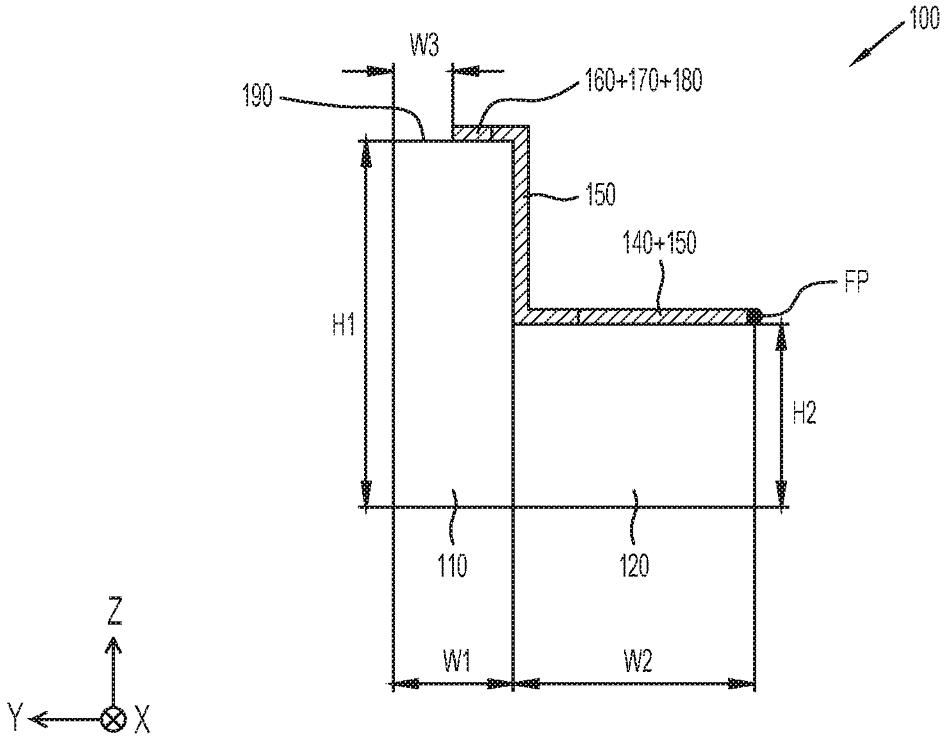
FIG. 1B is a side view of a portion of the mobile device according to an embodiment of the present invention.

FIG. 1A is a plan view of a portion of a mobile device according to an embodiment of the present invention and FIG. 1B is a side view of a portion of the mobile device according to an embodiment of the present invention, and reference is made to both of these figures in the following description.

As noted, a mobile device 100 may be, e.g., a smart phone, a notebook computer, or a notebook computer. As shown in FIGS. 1A and 1B, the mobile device 100 at least includes: a first nonconductive support member 110, a second nonconductive support member 120, and an antenna structure 130. Those skilled in the art will appreciate that, although not shown in FIGS. 1A and 1B, the mobile device 100 may further include other components such as a display device, a speaker, a touch control module, a power supply module and a housing.

The first nonconductive support member 110 and the second nonconductive support member 120 may be made of, e.g., a plastic material. In one embodiment, the first nonconductive support member 110 may form part of an "appearance edge portion" of the mobile device 100, i.e., a visible outside edge portion of the mobile device 100 that a user can directly observe with his/her eye. The second nonconductive support member 120 may be an antenna placement platform or a display placement platform, on which an antenna structure or a display can be disposed.

The first nonconductive support member 110 and the second nonconductive support member 120 are adjacent to each other and have different heights in the Z-axis. For example, the height H1 of the first nonconductive support member 110 may be greater than the height H2 of the second nonconductive support member 120. In one possible embodiment, height H1 may be more than twice the height H2. In the instant description, the word "adjacent" may mean that the distance between two corresponding elements is less than a predetermined distance (for example, 1 mm or less), and may also mean that the two corresponding elements are in direct contact with each other.

In addition, the first nonconductive support member 110 and the second nonconductive support member 120 may have different widths on the Y-axis. For example, the width W1 of the first nonconductive support member 110 may be smaller than the width W2 of the second nonconductive support member 120.

Those skilled in the art will appreciate that the shapes of the first nonconductive support member 110 and the second nonconductive support member 120 are not limited to the shapes depicted in the figures, but can be modified according to different needs.

The antenna structure 130 may be made of a metal material, and may be configured as follows. The antenna structure 130 includes a feeding element 140, a first connecting portion 150, a second connecting portion 160, a first radiating portion 170, and a second radiating portion 180. The antenna structure 130 has a three-dimensional structure and is formed on the first nonconductive support member 110 and the second nonconductive support member 120 having the aforementioned height difference. For example, the second connecting portion 160, the first radiating portion 170, and the second radiating portion 180 may be distributed only on the first nonconductive support member 110, the feeding element 140 may be only distributed on the second nonconductive support member 120, and the first connecting portion 150 may be distributed on the first nonconductive support element 110 and the second nonconductive support element 120 at the same time.

In some embodiments, a metal-free region 190 is formed between one edge 111 of the first nonconductive support member 110 and one of the second connecting element 160, the first radiating portion 170, and the second radiating portion 180. The metal-free region 190 may be formed as an elongated rectangle having an equal width W3.

The feeding element 140 may substantially assume an L-shape. The feeding element 140 has a first end 141 and a second end 142. The first end 141 of the feeding element 140 is coupled to a feeding point FP. A signal source (not shown) may be coupled to the feeding point FP. The first connecting portion 150 may substantially assume a rectangular shape, and the second connecting portion 160 may also substantially assume another rectangular shape. The width W4 of the first connecting portion 150 may be greater than the width W5 of the second connecting portion 160. The first connecting portion 150 is coupled to the second end 142 of the feeding element 140. The second connecting portion 160 is coupled to the first connecting portion 150. Both the first connecting portion 150 and the second connecting portion 160 are substantially between the first radiating portion 170 and the second radiating portion 180.

The first radiating portion 170 may substantially have a straight stripe or bar shape. The first radiating portion 170 has a first end 171 and a second end 172. The first end 171 of the first radiating portion 170 is coupled to the feeding element 140 via the second connecting portion 160 and the first connecting portion 150. The second end 172 of the first radiating portion 170 is an open end. A gap G1 may be formed between the first radiating portion 170 and the feeding element 140, which may substantially assume an elongated straight stripe, or rectangular, shape. The second radiating portion 180 may substantially assume another straight stripe shape. The second radiating portion 180 has a first end 181 and a second end 182. The first end 181 of the second radiating portion 180 is coupled to the feeding element 140 through the second connecting portion 160 and the first connecting portion 150. The second end 182 of the second radiating portion 180 is an open end. The length L2 of the second radiating portion 180 is shorter than the length L1 of the first radiating portion 170. The width of each of the first radiating portion 170 and the second radiating portion 180 may be the same as the width W5 of the second connecting portion 160. The second end 172 of the first radiating portion 170 and the second end 182 of the second radiating portion 180 may extend in different or opposite directions. For example, the second end 172 of the first radiating portion 170 may extend in the +X axis direction, and the second end 182 of the second radiating portion 180 may extend in the −X axis direction.

In some embodiments, the mobile device 100 is a convertible mobile device and is operable in either a notebook mode or a tablet mode. While operating in either the notebook mode or the tablet mode, the antenna structure 130 of the mobile device 100 can have similar operating performance as described below.

Figure 2:
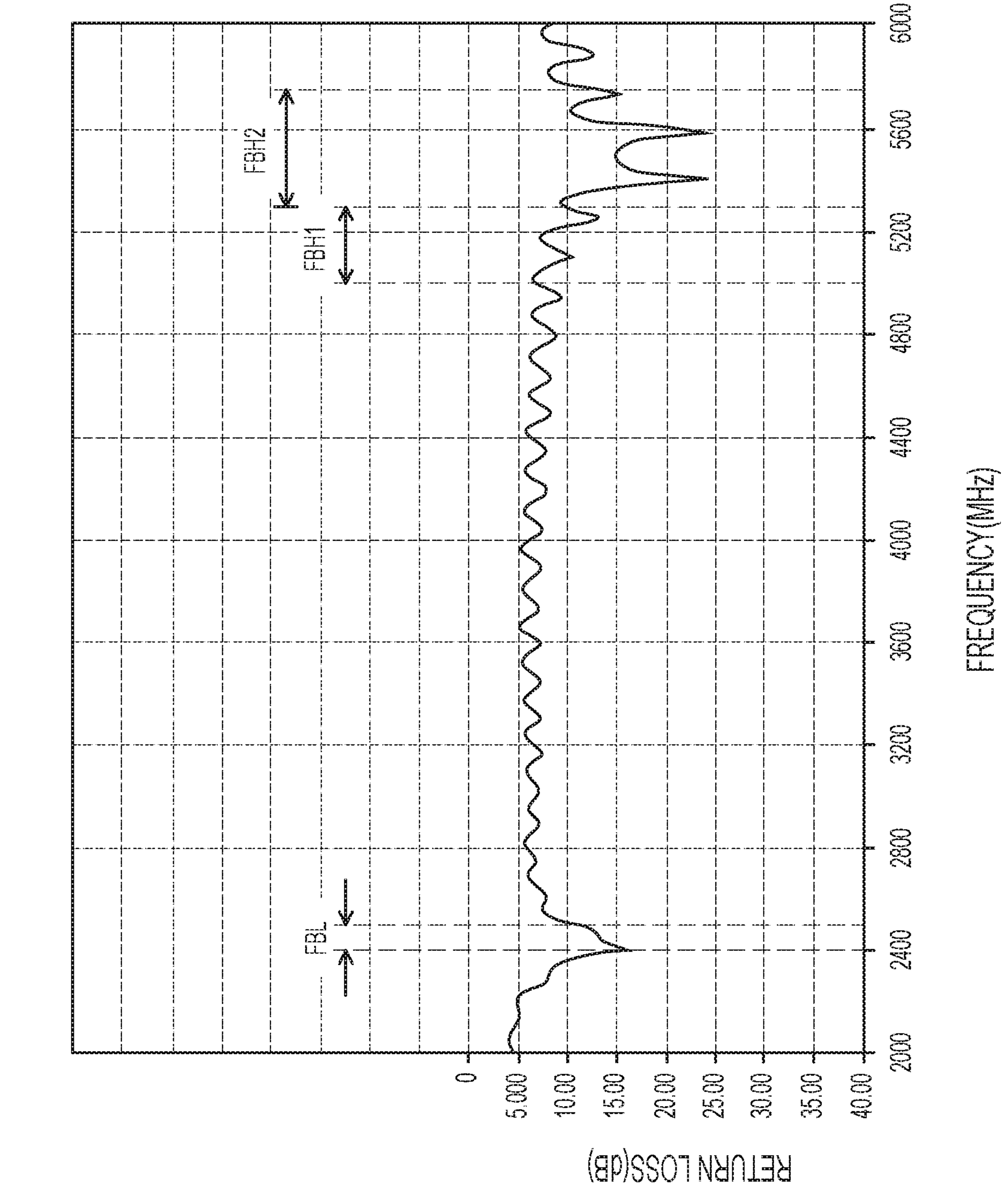
FIG. 2 is a graph showing return loss of the antenna structure depicted in FIGS. 1A and 1B when the mobile device operates in a notebook mode according to an embodiment of the present invention.
Figure 3:
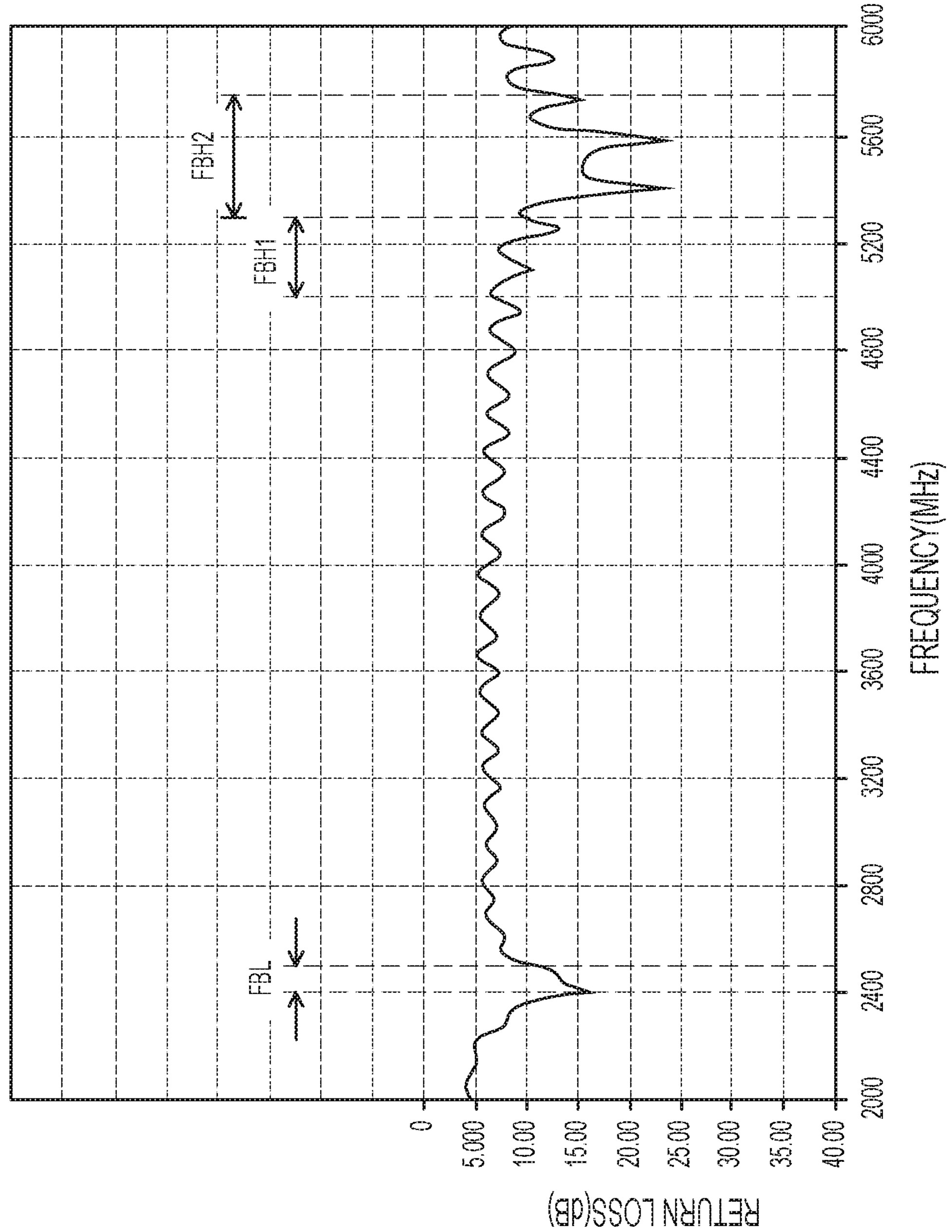
FIG. 3 is a graph showing return loss of the antenna structure depicted in FIGS. 1A and 1B when the mobile device operates in a tablet mode according to an embodiment of the present invention.

FIG. 2 is a graph showing return loss of the antenna structure depicted in FIGS. 1A and 1B when the mobile device operates in the notebook mode according to an embodiment of the present invention, and FIG. 3 is a graph showing return loss of the antenna structure depicted in FIGS. 1A and 1B when the mobile device operates in the tablet mode according to an embodiment of the present invention.

Referring to FIGS. 2 and 3, the horizontal axis represents operating frequency (MHz) and the vertical axis represents return loss (dB). According to measurement results shown in FIGS. 2 and 3, the antenna structure 130 can cover a low frequency band FBL, a first high frequency band FBH1, and a second high frequency band FBH2. The low frequency band FBL is between 2400 MHz and 2500 MHz, the first high frequency band FBH1 is between 5000 MHz and 5300 MHz, and the second high frequency band FBH2 is between 5300 MHz and 5750 MHz. Therefore, the antenna structure 130 can support at least wireless local area network (WLAN) 2.4 GHz/5 GHz dual band operation.

Figure 4:
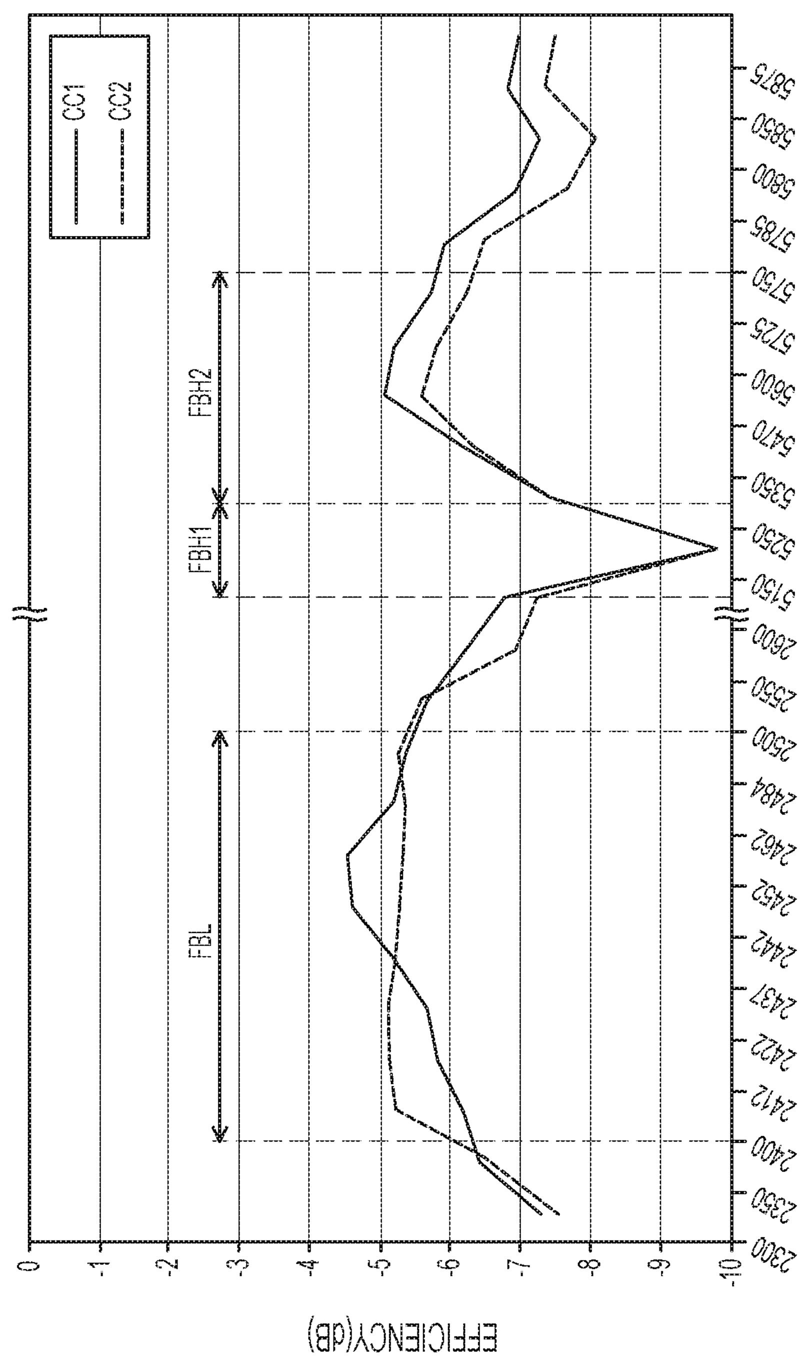
FIG. 4 is a graph of antenna efficiency of the antenna structure depicted in FIGS. 1A and 1B according to the present invention.

FIG. 4 is a graph of antenna efficiency of the antenna structure depicted in FIGS. 1A and 1B according to the present invention. In the figure, the horizontal axis represents operating frequency (MHz) and the vertical axis represents antenna efficiency (dB). In addition, a first curve CC1 represents the characteristics of the antenna structure 130 when the mobile device 100 operates in the notebook mode, and a second curve CC2 represents the characteristics of the antenna structure 130 when the mobile device 100 operates in the tablet mode. As shown in FIG. 4, the antenna efficiency of the antenna structure 130 in the low-frequency band FBL may be about −4.5 dB, and the antenna efficiency in the first high-frequency band FBH1 and the second high-frequency band FBH2 may be about −5 dB. Such performance meets the practical application requirements of general mobile communication devices in the several bands discussed herein.

The principle of antenna operation of the mobile device 100 may be described as follows. The feeding element 140, the first connecting portion 150, the second connecting portion 160, and the first radiating portion 170 can jointly excite a fundamental resonant mode to form the aforementioned low frequency band FBL. The feeding element 140, the first connecting portion 150, the second connecting portion 160, and the first radiating portion 170 can further jointly generate a higher-order resonant mode to form the aforementioned first high-frequency band FBH1 (two times the low frequency). The feeding element 140 and the first connecting portion 150 may jointly excite and generate a resonant mode to form the aforementioned second high frequency band FBH2. A combination of the first connecting portion 150 and the second connecting portion 160 can be used to fine tune the low frequency band FBL, the first high frequency band FBH1, and impedance matching for the second high frequency band FBH2 to simultaneously increase the antenna structure 130's high and low frequency bandwidth. Further, the combination of one of the second connecting portion 160 and the second radiating portion 180 can be used to fine tune the impedance matching for the first high frequency band FBH1 and the second high frequency band FBH2 to increase the high frequency bandwidth of the antenna structure 130.

In one implementation, the size of the components of the mobile device 100 are as follows. A total radiation length may be defined as including the feeding element 140, the first connecting portion 150, the second connecting portion 160, and the first radiating portion 170 (i.e., from the first end 141, past the second end 142, the first connecting portion 150, and the second connecting portion 160). The total length of the connecting portion 160, the first end 171, and the second end 172 may be substantially equal to 0.5 wavelength (λ/2) of the low-frequency band FBL. The total length of the feeding element 140 and the first connecting portion 150 (i.e., the total length from the first end 141, the second end 142, and the junction of the first connecting portion 150 and the second connecting portion 160) may be approximately equal to 0.5 wavelength (λ/2) of the second high-frequency band FBH2.

The height H1 of the first nonconductive support member 110 may be about 3 mm. The height H2 of the second nonconductive support member 120 may be between 1.2 mm and 1.4 mm, inclusive. The width W1 of the first nonconductive support member 110 may be about 2 mm. The width W2 of the second nonconductive support member 120 may be about 4.5 mm. The width W3 of the metal-free region 190 may be between 1 mm and 1.2 mm, inclusive. The length L1 of the first radiating portion 170 may be approximately four times the length L2 of the second radiating portion 180. The length L3 of each of the first connecting portion 150 and the second connecting portion 160 may be between 3 mm and 5 mm, inclusive. The total width (W4+W5) of the first connecting portion 150 and the second connection portion 160 may be between 3 mm and 4 mm, inclusive. The width of the gap G1 may be between 1 mm and 2 mm, inclusive.

In the mobile device 100 of the present invention, the antenna structure 130 can serve as a hidden antenna. That is, the antenna structure 130 can be integrated with the appearance edge portion of the mobile device 100 (e.g., the first nonconductive support member 110 may correspond to the "thickness" side of the mobile device 100). As will be seen with reference to FIG. 5A, the height difference between the first nonconductive support member 110 and the second nonconductive support member 120 achieves the purpose of hidden design. In addition, the edge portion of the mobile device 100 and the antenna structure 130 may further be treated with a spray and coat process to reduce the visual difference between the non-metal and metal portions to mask any difference in appearance.

It is noted that the metal-free region 190 on the first nonconductive support member 110 may be reserved for use in adhering (or gluing) an appearance mechanism element of the mobile device 100. In such a design, the total width of the antenna structure 130 on the Y axis and the total height on the Z axis can be effectively reduced, so that desired miniaturization of the mobile device 100 can be achieved. The disclosed antenna structure 130 has good impedance matching and no additional antenna placement platform is needed. As such, the present invention can reduce manufacturing costs in connection with radio frequency (RF) and electromagnetic compatibility (EMC) solutions. At the same time, the overall weight of the mobile device 100 may be reduced.

Figure 5A:
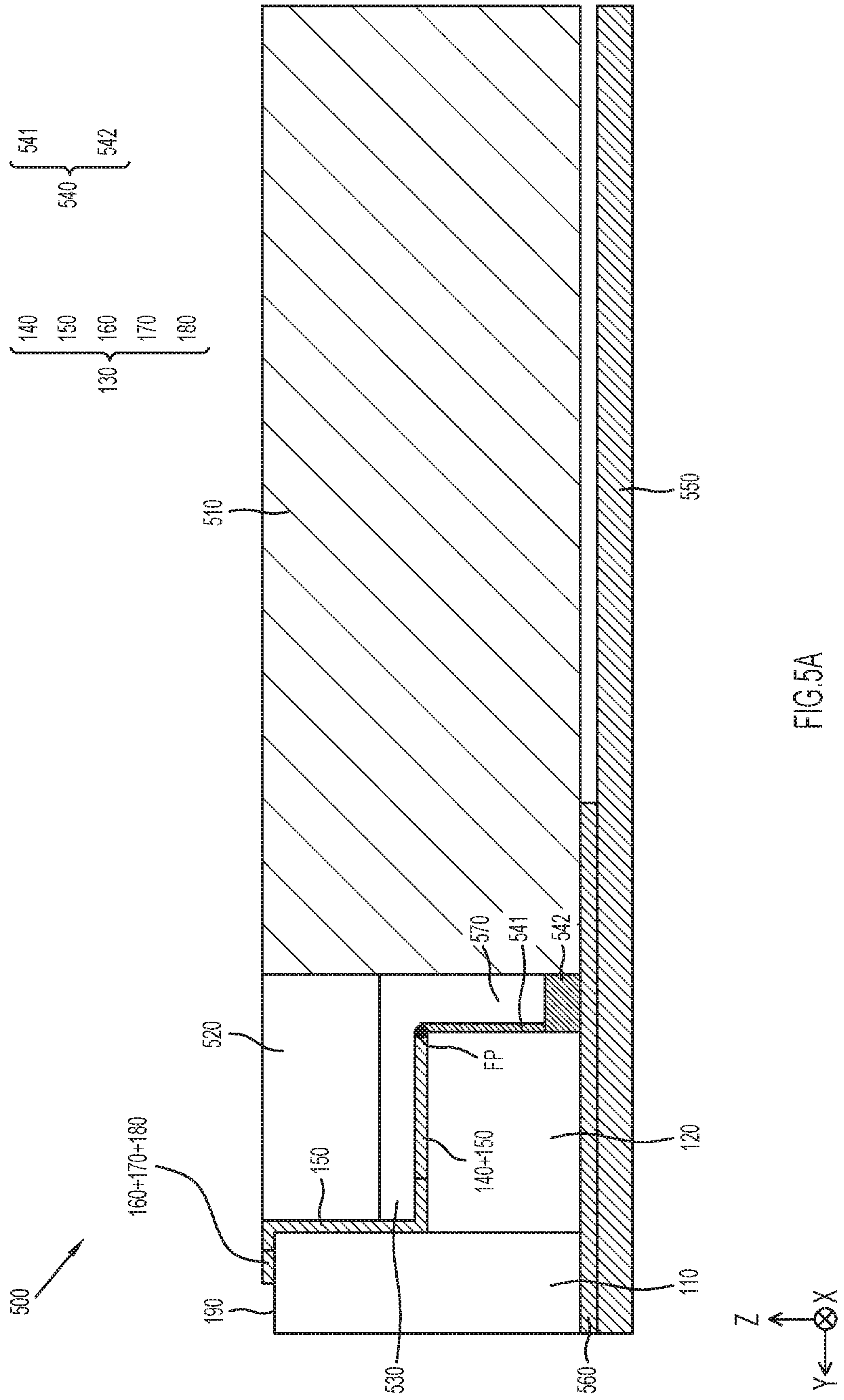
FIG. 5A is a side view of another configuration of the mobile device according to an embodiment of the present invention.

FIG. 5A is a side view of another configuration of the mobile device according to an embodiment of the present invention. FIG. 5A is similar to FIG. 1B. In the embodiment shown in FIG. 5A, a mobile device 500 further includes a display device 510, a display frame 520, a coaxial cable 540, and a metal back cover 550, and metal foil 560.

Figure 5B:
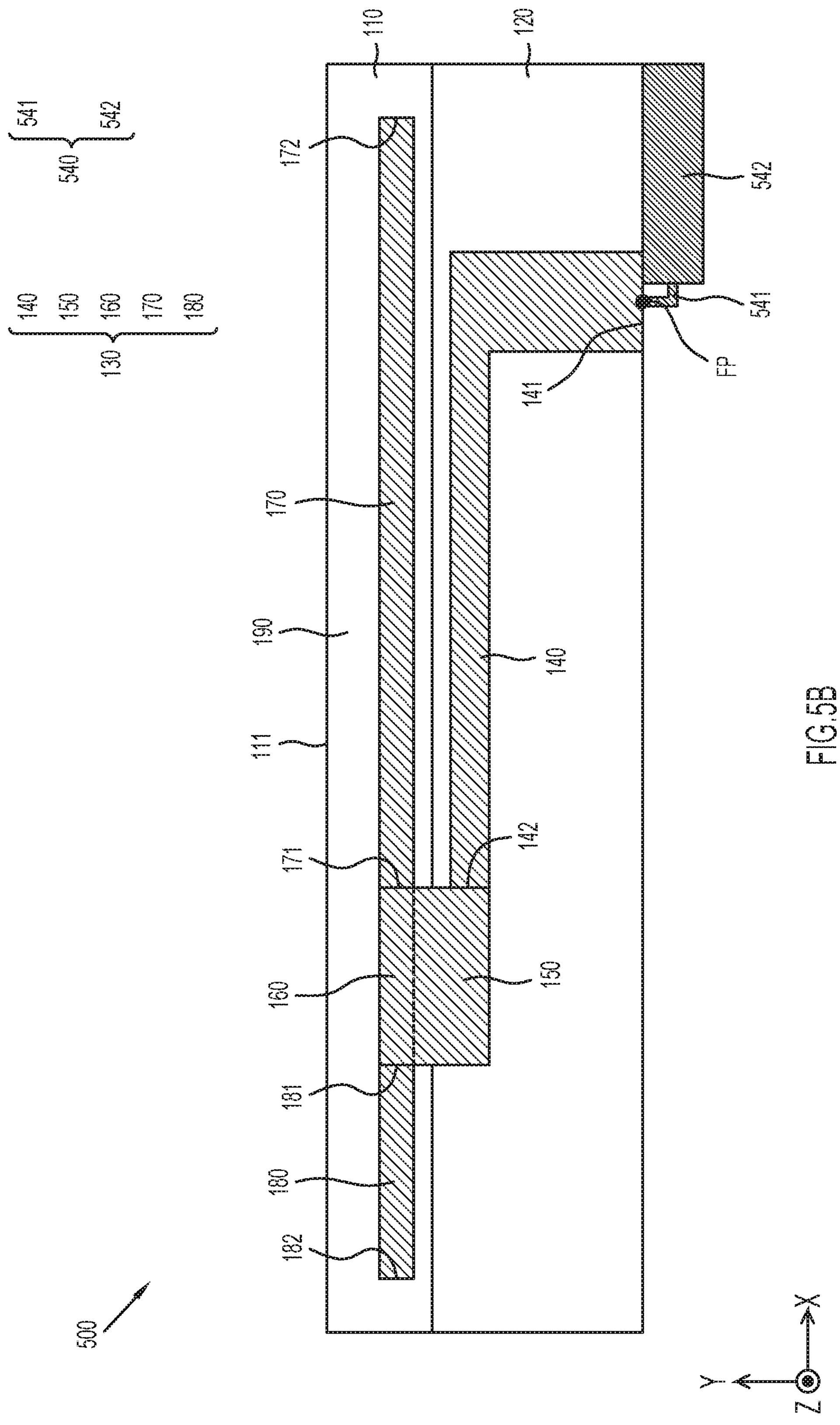
FIG. 5B is a plan view of a portion of the mobile device according to another embodiment of the present invention.

FIG. 5B is a plan view of a portion of the mobile device according to another embodiment of the present invention. To avoid visual masking, only the first nonconductive support member 110, the second nonconductive support member 120, the antenna structure 130, and the coaxial cable 540 are shown.

In the embodiments of FIGS. 5A and 5B, the mobile device 500 is a notebook computer, and the metal back cover 550 and the display frame 520 respectively refer to a "piece A" and a "piece B" of the notebook computer. The display frame 520 may be made of a non-conductive material, such as a plastic. Display frame 520 is adjacent display 510 and may surround each of four edges of the display 510. More specifically, the display frame 520 extends into a height-difference notch 530 defined by the first nonconductive support member 110 and the second nonconductive support member 120. Since the display frame 520 is non-conducting, it can be directly attached to the first nonconductive support member 110 and the antenna structure 130 to improve overall structural stability, and does not adversely affect the radiation pattern of the antenna structure 130. The display 510, itself, may not be suitable for direct contact with the antenna structure 130 as it typically includes metal components.

A source (not shown) may be coupled to the feed point FP via coaxial cable 540 to excite antenna structure 130. Coaxial cable 540 includes a center conductor 541 and a conductive sheath 542. The center conductor 541 of the coaxial cable 540 is coupled to the feed point FP. Conductive sheath 542 of coaxial cable 540 is coupled to metal back cover 550 via metal foil 560. It is noted that the coaxial cable 540 is disposed between the display 510 and the second non-conducting support member 120 and is adjacent the metal back cover 550. Such a design can hide the coaxial cable 540 in the internal space of the mobile device 500, so as to avoid interference of the coaxial cable 540 with the antenna structure 130 and other elements of the mobile device 500. The metal foil 560 can be a grounded copper foil, which can be attached to the conductor housing 542 of the coaxial cable 540 and extend to the metal back cover 550. The metal back cover 550 is adjacent the first nonconductive support member 110, the second nonconductive support member 120, the antenna structure 130, and the display 510, so that the metal back cover 550 can be considered as a ground plane of the antenna structure 130. In this design, the metal back cover 550 does not interfere with the radiation pattern of the antenna structure 130, but can further enhance the radiation efficiency of the antenna structure 130.

Thus, the present invention proposes a novel mobile device that includes a hidden antenna structure. Such an antenna structure can be integrated with the metal back cover (piece A) or the display frame (piece B), and can effectively utilize the space of the appearance edge portion of the mobile device and its adjacent portion. In general, the present invention has at least a small size, a wide frequency band, a reduced manufacturing cost, reduced overall weight, and an aesthetically pleasing appearance for a mobile device, and is therefore very suitable for use in a variety of narrow-frame (thin) mobile communication devices.

The above description is intended by way of example only.

What is claimed is:

1. A mobile device, comprising:
- a first nonconductive support member;
- a second nonconductive support member adjacent to, and lower than, the first nonconductive supporting member;
- an antenna structure including:
  - a first radiating portion disposed on the first nonconductive support member;
  - a second radiating portion disposed on the first nonconductive support member and extending in a direction opposite to the first radiating portion;
  - a feeding element; and
  - a connecting portion disposed on the first nonconductive support member and the second nonconductive support member that couples the first radiating portion and the second radiating portion to each other and to the feeding element,
- wherein the first nonconductive support member is part of a visible edge portion of the mobile device; and
- a display having a display frame surrounding the display, wherein the display frame is disposed in a notch created by a difference in height between the first nonconductive support member and the second nonconductive support member.

2. The mobile device of claim 1, wherein the connecting portion comprises a first connecting portion and a second connecting portion, the second connecting portion coupling the first radiating portion and the second radiating portion to each other, and the first connecting portion coupling the feeding element to the second connecting portion.

3. The mobile device of claim 2, wherein the first connecting portion is disposed on the first nonconductive support member and the second nonconductive support member, and the second connecting portion is disposed on the first nonconductive support member.

4. The mobile device of claim 1, wherein the feeding element is disposed on the second nonconductive support member.

5. The mobile device of claim 1, wherein the antenna structure is configured to resonate at a low frequency band, a first high frequency band and a second high frequency band.

6. The mobile device of claim 5, wherein the low frequency band is between 2400 MHz and 2500 MHz, the first high frequency band is between 5000 MHz and 5300 MHZ, and the second high frequency band is between 5300 MHz and 5700 MHz.

7. The mobile device of claim 1, wherein the mobile device is a laptop computer.

8. The mobile device of claim 1, wherein a stripe-like gap is created between the first radiating portion and at least a portion of the feeding element.

9. The mobile device of claim 1, further comprising a coaxial cable having an inner conductor and an outer conductor, the inner conductor coupled to a feed point of the feeding element, and the outer conductor coupled to a ground plane of the mobile device.

10. A mobile device, comprising:
- a first nonconductive support member;
- a second nonconductive support member adjacent to, and lower than, the first nonconductive supporting member;
- an antenna structure including:
  - a first rectangular radiating portion disposed on the first nonconductive support member;
  - a second rectangular radiating portion disposed on the first nonconductive support member and extending in a direction opposite to the first rectangular radiating portion;
  - an L-shaped feeding element having a portion that is parallel to the first rectangular radiating portion, and which creates a gap between the portion that is parallel to the first rectangular radiating portion and the first rectangular radiating portion;
  - a connecting portion disposed on the first nonconductive support member and second nonconductive support member that couples the first rectangular radiating portion and the second rectangular radiating portion to each other and to the feeding element,
  - wherein the first nonconductive support member is part of a visible edge portion of the mobile device; and
- a display having a display frame surrounding the display, wherein the display frame is disposed in a notch created by a difference in height between the first nonconductive support member and the second nonconductive support member.

11. The mobile device of claim 10, wherein the connecting portion comprises a first connecting portion and a second connecting portion, the second connecting portion coupling the first rectangular radiating portion and the second rectangular radiating portion to each other, and the first connecting portion coupling the feeding element to the second connecting portion.

12. The mobile device of claim 11, wherein the first connecting portion is disposed on the first nonconductive support member and the second nonconductive support member, and the second connecting portion is disposed on the first nonconductive support member.

13. The mobile device of claim 10, wherein the feeding element is disposed on the second nonconductive support member.

14. The mobile device of claim 10, wherein the antenna structure is configured to resonate at a low frequency band, a first high frequency band and a second high frequency band.

15. The mobile device of claim 14, wherein the low frequency band is between 2400 MHz and 2500 MHz, the first high frequency band is between 5000 MHz and 5300 MHZ, and the second high frequency band is between 5300 MHz and 5700 MHz.

16. The mobile device of claim 10, wherein the mobile device is a laptop computer.

17. The mobile device of claim 10, wherein the gap extends over the first nonconductive support member and the second nonconductive support member.

18. The mobile device of claim 10, further comprising a coaxial cable having an inner conductor and an outer conductor, the inner conductor coupled to a feed point of the feeding element, and the outer conductor coupled to a ground plane of the mobile device.

19. A mobile device, comprising:

a first nonconductive support member;

a second nonconductive support member adjacent to, and lower than, the first nonconductive supporting member, and an antenna structure including:

a first radiating portion disposed on the first nonconductive support member;

a second radiating portion disposed on the first nonconductive support member and extending in a direction opposite to the first radiating portion;

a feeding element; and a connecting portion disposed on the first nonconductive support member and the second nonconductive support member that couples the first radiating portion and the second radiating portion to each other and to the feeding element, wherein the first nonconductive support member is part of a visible edge portion of the mobile device, wherein the connecting portion comprises a first connecting portion and a second connecting portion, the second connecting portion coupling the first radiating portion and the second radiating portion to each other, and the first connecting portion coupling the feeding element to the second connecting portion, and wherein the first connecting portion is disposed on the first nonconductive support member and the second nonconductive support member, and the second connecting portion is disposed on the first nonconductive support member.

* * * * *